United States Patent
Aarts et al.

(10) Patent No.: US 9,710,575 B2
(45) Date of Patent: Jul. 18, 2017

(54) HYBRID PLATFORM-DEPENDENT SIMULATION INTERFACE

(71) Applicant: International Business Machines Corporation, Armonk, NY (US)

(72) Inventors: Thomas W. Aarts, Leander, TX (US); Stephan O. Broyles, Austin, TX (US); William G. Hoffa, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 666 days.

(21) Appl. No.: 13/775,201

(22) Filed: Feb. 24, 2013

(65) Prior Publication Data

US 2014/0157289 A1 Jun. 5, 2014

Related U.S. Application Data

(63) Continuation of application No. 13/690,993, filed on Nov. 30, 2012, now abandoned.

(51) Int. Cl.
| | |
|---|---|
| G06F 3/00 | (2006.01) |
| G06F 9/44 | (2006.01) |
| G06F 9/46 | (2006.01) |
| G06F 13/00 | (2006.01) |
| G06F 17/50 | (2006.01) |
| G06F 9/54 | (2006.01) |

(52) U.S. Cl.
CPC .......... *G06F 17/5009* (2013.01); *G06F 9/541* (2013.01)

(58) Field of Classification Search
None
See application file for complete search history.

(56) References Cited

U.S. PATENT DOCUMENTS

| | | | |
|---|---|---|---|
| 6,195,593 B1 * | 2/2001 | Nguyen | 700/97 |
| 6,356,957 B2 | 3/2002 | Sanchez, II et al. | |
| 6,735,747 B2 * | 5/2004 | Watkins | 716/106 |
| 6,970,697 B2 | 11/2005 | Kouznetsov et al. | |
| 7,478,408 B2 | 1/2009 | Sesma | |
| 7,720,670 B2 * | 5/2010 | Agarwala | 703/23 |
| 7,945,918 B2 | 5/2011 | Blue et al. | |
| 8,060,856 B2 | 11/2011 | Besbris et al. | |
| 2003/0014553 A1 | 1/2003 | Zhao | |

(Continued)

OTHER PUBLICATIONS

Virtutech AB; Simics User Guide for Unix; Simics Version 3.0; Part IV; Sections 12.1-12.1.7; 2007 (6 pages).

*Primary Examiner* — Chat Do
*Assistant Examiner* — William C Wood
(74) *Attorney, Agent, or Firm* — James L. Baudino

(57) ABSTRACT

According to one aspect of the present disclosure, a method and technique for a hybrid platform-dependent simulation interface is disclosed. The method includes: encoding an application with a library having a platform-independent application programming interface (API) for interacting with a simulation engine, the simulation engine providing a simulated environment for hosting the application; and encoding the library with a platform-dependent API providing an interface to the simulation engine using a platform-dependent hardware element, the platform-dependent hardware element unaffecting a non-simulation environment when the application is running in the non-simulation environment.

12 Claims, 4 Drawing Sheets

(56) References Cited

U.S. PATENT DOCUMENTS

| | | |
|---|---|---|
| 2003/0184783 A1 | 10/2003 | Shahindoust et al. |
| 2005/0289214 A1 | 12/2005 | Adjakple et al. |
| 2009/0024381 A1* | 1/2009 | Sakamoto et al. .............. 703/26 |
| 2012/0131269 A1* | 5/2012 | Fisher et al. .................. 711/103 |
| 2012/0265516 A1* | 10/2012 | Ark et al. ....................... 703/21 |

* cited by examiner

HYBRID PLATFORM-DEPENDENT SIMULATION INTERFACE

BACKGROUND

A software application may sometimes be run in a simulation environment for verification or other purposes. For example, running a software application in a simulation environment that simulates a particular target operating system/hardware platform that the software application is intended to run on enables verification that instructions and/or other program-related operations are performed as intended/expected.

BRIEF SUMMARY

According to one aspect of the present disclosure a method and technique for a hybrid platform-dependent simulation interface is disclosed. The method includes: encoding an application with a library having a platform-independent application programming interface (API) for interacting with a simulation engine, the simulation engine providing a simulated environment for hosting the application; and encoding the library with a platform-dependent API providing an interface to the simulation engine using a platform-dependent hardware element, the platform-dependent hardware element unaffecting a non-simulation environment when the application is running in the non-simulation environment.

BRIEF DESCRIPTION OF THE SEVERAL VIEWS OF THE DRAWINGS

For a more complete understanding of the present application, the objects and advantages thereof, reference is now made to the following descriptions taken in conjunction with the accompanying drawings, in which.

DETAILED DESCRIPTION

Figure 1:
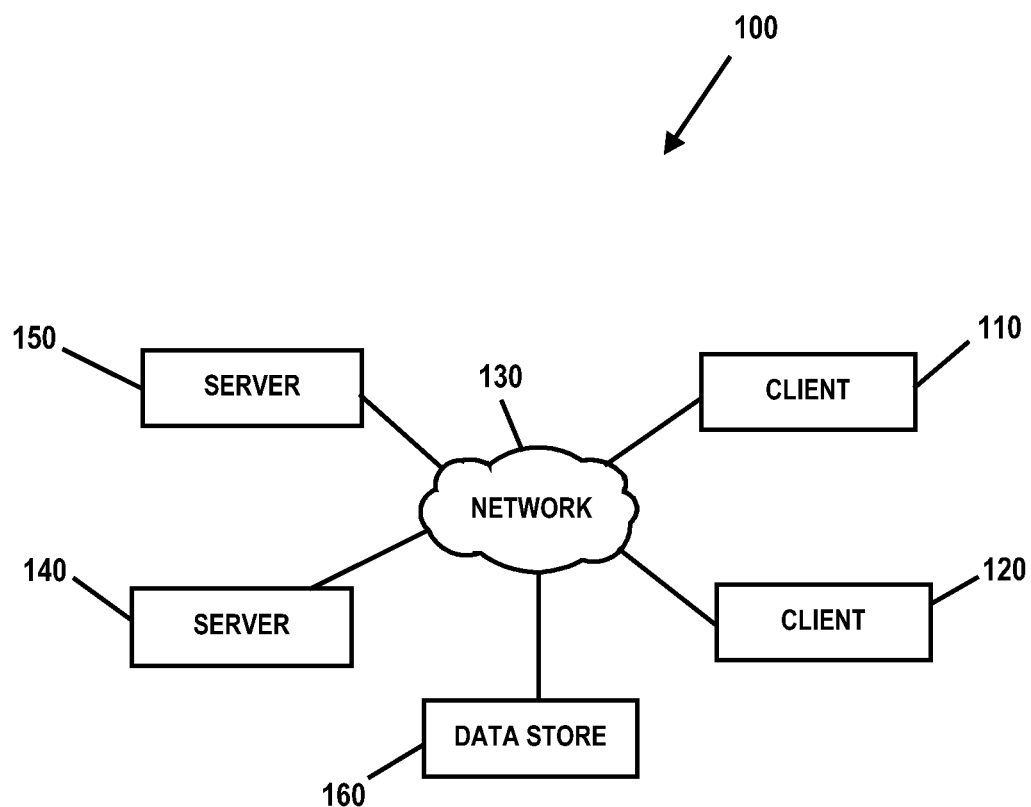
FIG. 1 is an embodiment of a network of data processing systems in which the illustrative embodiments of the present disclosure may be implemented.

Embodiments of the present disclosure provide a method and technique for a hybrid platform-dependent simulation interface. For example, in some embodiments, the method and technique includes: encoding an application with a library having a platform-independent application programming interface (API) for interacting with a simulation engine, the simulation engine providing a simulated environment for hosting the application; and encoding the library with a platform-dependent API providing an interface to the simulation engine using a platform-dependent hardware element, the platform-dependent hardware element unaffecting a non-simulation environment when the application is running in the non-simulation environment. Embodiments of the present disclosure enable utilization of hardware elements from a target platform/environment for simulation environment functions such that the selected hardware elements, if similarly utilized in the non-simulation environment, would not impact or adversely affect the non-simulation platform or running application. For example, embodiments of the present disclosure re-purpose and/or extend hardware elements that would be present in a non-simulation environment for simulation environment functions. The selected hardware elements may be unused hardware elements or other types of hardware elements that if similarly controlled/used in the non-simulation environment, the application and non-simulation platform would be unaffected by such use. The simulation library enabling the use of such re-purposed/extended hardware elements for simulation functions is coded as part of the application itself, thereby resulting in the application being executable in simulation or non-simulation environments without an indication to the application that it may be running in a simulation environment. Thus, the simulation library that is encoded as part of the application effectively hides from the application the particular environment (simulation or non-simulation) the application is running in.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer usable or computer readable medium(s) may be utilized. The computer readable medium may be a computer readable signal medium or a computer readable storage medium. A computer readable storage medium may be, for example but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
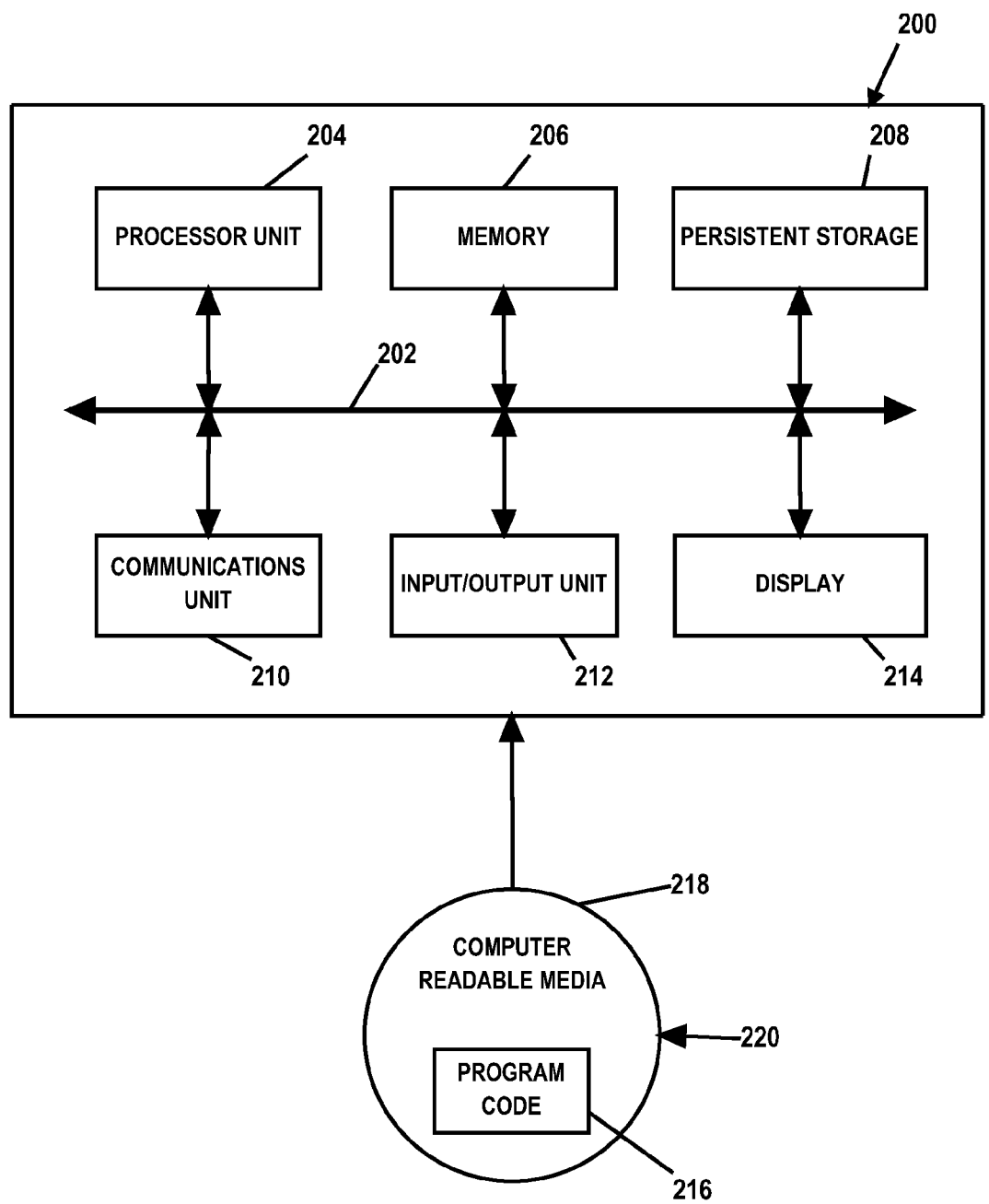
FIG. 2 is an embodiment of a data processing system in which the illustrative embodiments of the present disclosure may be implemented.

With reference now to the Figures and in particular with reference to FIGS. 1-2, exemplary diagrams of data processing environments are provided in which illustrative embodiments of the present disclosure may be implemented. It should be appreciated that FIGS. 1-2 are only exemplary and are not intended to assert or imply any limitation with regard to the environments in which different embodiments may be implemented. Many modifications to the depicted environments may be made.

FIG. 1 is a pictorial representation of a network of data processing systems in which illustrative embodiments of the present disclosure may be implemented. Network data processing system 100 is a network of computers in which the illustrative embodiments of the present disclosure may be implemented. Network data processing system 100 contains network 130, which is the medium used to provide communications links between various devices and computers connected together within network data processing system 100. Network 130 may include connections, such as wire, wireless communication links, or fiber optic cables.

In some embodiments, server 140 and server 150 connect to network 130 along with data store 160. Server 140 and server 150 may be, for example, IBM System P® servers. In addition, clients 110 and 120 connect to network 130. Clients 110 and 120 may be, for example, personal computers or network computers. In the depicted example, server 140 provides data and/or services such as, but not limited to, data files, operating system images, and applications to clients 110 and 120. Network data processing system 100 may include additional servers, clients, and other devices.

In the depicted example, network data processing system 100 is the Internet with network 130 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

FIG. 2 is an embodiment of a data processing system 200 such as, but not limited to, client 110 and/or server 140 in which an embodiment of a system for a hybrid platform-dependent simulation interface according to the present disclosure may be implemented. In this embodiment, data processing system 200 includes a bus or communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

In some embodiments, memory 206 may be a random access memory or any other suitable volatile or non-volatile storage device. Persistent storage 208 may take various forms depending on the particular implementation. For example, persistent storage 208 may contain one or more components or devices. Persistent storage 208 may be a hard drive, a flash memory, a rewritable optical disk, a rewritable magnetic tape, or some combination of the above. The media used by persistent storage 208 also may be removable such as, but not limited to, a removable hard drive.

Communications unit 210 provides for communications with other data processing systems or devices. In these examples, communications unit 210 is a network interface card. Modems, cable modem and Ethernet cards are just a few of the currently available types of network interface adapters. Communications unit 210 may provide communications through the use of either or both physical and wireless communications links.

Input/output unit 212 enables input and output of data with other devices that may be connected to data processing system 200. In some embodiments, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer usable program code, or computer readable program code that may be read and executed by a processor in processor unit 204. The program code in the different embodiments may be embodied on different physical or tangible computer readable media, such as memory 206 or persistent storage 208.

Program code 216 is located in a functional form on computer readable media 218 that is selectively removable and may be loaded onto or transferred to data processing system 200 for execution by processor unit 204. Program code 216 and computer readable media 218 form computer program product 220 in these examples. In one example, computer readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable media 218 also may take the form of a persistent storage, such as a hard drive, a thumb drive, or a flash memory that is connected to data processing system 200. The tangible form of computer readable media 218 is also referred to as computer recordable storage media. In some instances, computer readable media 218 may not be removable.

Alternatively, program code 216 may be transferred to data processing system 200 from computer readable media 218 through a communications link to communications unit 210 and/or through a connection to input/output unit 212. The communications link and/or the connection may be physical or wireless in the illustrative examples.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. For example, a storage device in data processing system 200 is any hardware apparatus that may store data. Memory 206, persistent storage 208, and computer readable media 218 are examples of storage devices in a tangible form.

Figure 3:
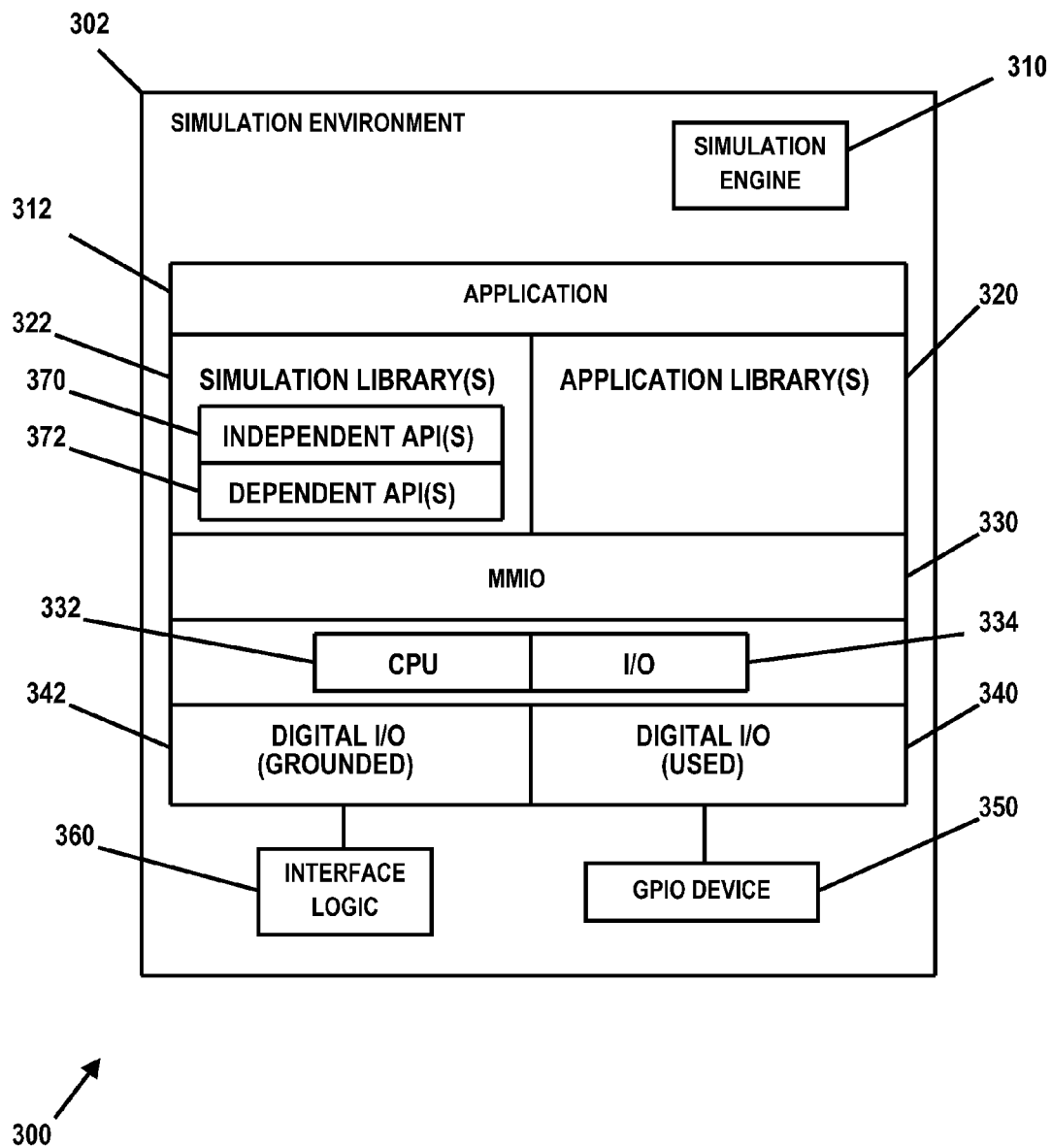
FIG. 3 is a diagram illustrating an embodiment of a data processing system for a hybrid platform-dependent simulation interface in which illustrative embodiments of the present disclosure may be implemented.

FIG. 3 is an illustrative embodiment of a system 300 for a hybrid platform-dependent simulation interface. System 300 may be implemented on data processing systems or platforms such as, but not limited to, servers 140 and/or 150, clients 110 and/or 120, or at other data processing system locations. In the embodiment illustrated in FIG. 3, system 300 comprises a simulation environment 302 with a simulation engine 310. Simulation environment 302 provided by simulation engine 310 is configured to simulate a target software/hardware platform for a software application 312. For example, the target software/hardware platform (or target non-simulation environment) may include a particular type of operating system, processor architecture, memory architecture, input/output (I/O) interfaces, bus interfaces, etc., that will host application 312 in a production or non-simulation environment. Simulation engine 310 may comprise software, logic and/or executable code for performing various functions as described herein (e.g., residing as software and/or an algorithm running on a processor unit, hardware logic residing in a processor or other type of logic chip, centralized in a single integrated circuit or distributed among different chips in a data processing system).

Generally, a software application may need to communicate with a software simulation environment when the environment is present. However, preferably, the software application would be configured to be unaware of whether the software application is running in a simulation environment or non-simulation/native environment. Embodiments of the present disclosure provide a simulation interface that is both platform independent and platform dependent that enables application communications with the simulation environment when present while also hiding from the application the environment in which the application is currently running.

In the embodiment illustrated in FIG. 3, application 312 is encoded and/or written to include one or more production and/or application libraries 320 and one or more simulation libraries 322. Libraries 320 and 322 may comprise software, logic and/or executable code for performing various functions as described herein (e.g., residing as software and/or an algorithm running on a processor unit, hardware logic residing in a processor or other type of logic chip, centralized in a single integrated circuit or distributed among different chips in a data processing system). In FIG. 3, simulation environment 302 includes a variety of types of simulated hardware components such as a memory mapped I/O interface 330, a central processing unit 332, an I/O interface 334, and two digital I/Os 340 and 342. However, it should be understood that simulation environment 302 may be configured to simulate additional and/or different types of software and/or hardware elements associated with a target non-simulation environment.

Libraries 320 are used by application 312 to affect a state change in, for example, digital I/O 340. Digital I/O 340 represents/simulates a real or native hardware element of a non-simulation environment for hosting application 312. For example, application 312 may make a call to an API in library 320 that invokes a device driver that performs the necessary operations (e.g., writes to MMIO 330) to change the state of digital I/O 340. In a non-simulation environment, digital I/O 340 may comprise a pin that is connected to a general purpose I/O device 350 or other hardware element such that digital I/O 340 is in use in the native or non-simulation environment.

Embodiments of the present disclosure re-purpose and/or extend the functions of existing hardware elements that would be found in the non-simulation environment to interface with simulation engine 310 in the simulation environment 302. For example, in FIG. 3, consider that digital I/O 342 would be unused in a non-simulation environment (e.g., connected to ground, no connection, etc.). In simulation environment 302, interface logic 360 may interface with digital I/O 342 in simulation environment 302 to use a change in state or data transfer associated with digital I/O 342 to interface with simulation engine 310 to indicate a command or other type of signal. Digital I/O 342 may also be used to input a condition/command to application 312 by simulation engine 310. Thus, in this context, the function of digital I/O 342 in a non-simulation environment would be that of non-use which is re-purposed to have a simulation-related function when application 312 is running in simulation environment 302. Accordingly, a select hardware element that would be found in the non-simulation environment is used in the simulation environment 302 for interfacing with simulation engine 310 such that use of the select hardware element in the non-simulation environment would not affect (or negligibly affect) the non-simulation platform or running application when running in the non-simulation environment.

In FIG. 3, simulation library 322 includes platform-independent APIs 370 and platform-dependent APIs 372. Platform-independent APIs 370 comprise programming interfaces that are configured to be independent of the non-simulation environment hosting application 312 such that the APIs 370 may be used with a variety of types of operating systems running on a variety of different hardware platforms. Platform-dependent APIs 372 are configured, designed and/or built for a particular target or native non-simulation environment that will be hosting application 312. For example, for a particular operating system/hardware non-simulation platform/environment, particular I/O pins, memory regions (e.g., regions of memory 206), signal buses (e.g., bus 202), etc., may be unused or would otherwise have no effect on such platform in response to calls from library 322 (e.g., digital I/O 342 attached to ground in the non-simulation platform). Thus, library 322 provides a simulator communication facility when running in simulation environment 302 but will not affect the state of application 312 or the non-simulation platform hosting application 312 when application 312 is not running in simulation environment 302. Library 322 APIs 372 are tailored to the particular target, non-simulation software/hardware platform application 312 will be running on such that select hardware elements may be re-purposed and/or extended for use in simulation environment 302. The simulation functionality provided by using unused or other benign non-simulation platform hardware elements may include, but not be limited to, real time logging control for select simulation objects, simulation environment 302 control (e.g., simulator fidelity level control, error injection control, performance mode control, etc.), trap on events, conditions or instructions, etc.

Thus, embodiments of the present disclosure utilize non-simulation environment hardware elements to provide simulation functionality where the use of such non-simulation environment hardware elements leave application 312 and the hosting non-simulation platform unaffected when not running in the simulation environment 302. In some embodiments, hardware elements in the non-simulation environment may be extended to provide additional simulator functionality. For example, in some embodiments, an address range on a processor local bus present in the non-simulation environment may be extended in simulation environment 302 to provide additional simulator functionality. Additionally, "ghost" peripheral devices may be added in simulation environment 302 to I/O buses present in the non-simulation environment (e.g., an I²C peripheral device) where such peripheral devices may be used for additional simulation actions. Thus, library 322 is encoded, included and/or otherwise forms part of application 312 that would run in a non-simulation environment such that library 322 does not adversely affect non-simulation use of the application 312 or the non-simulation platform running the application 312.

Figure 4:
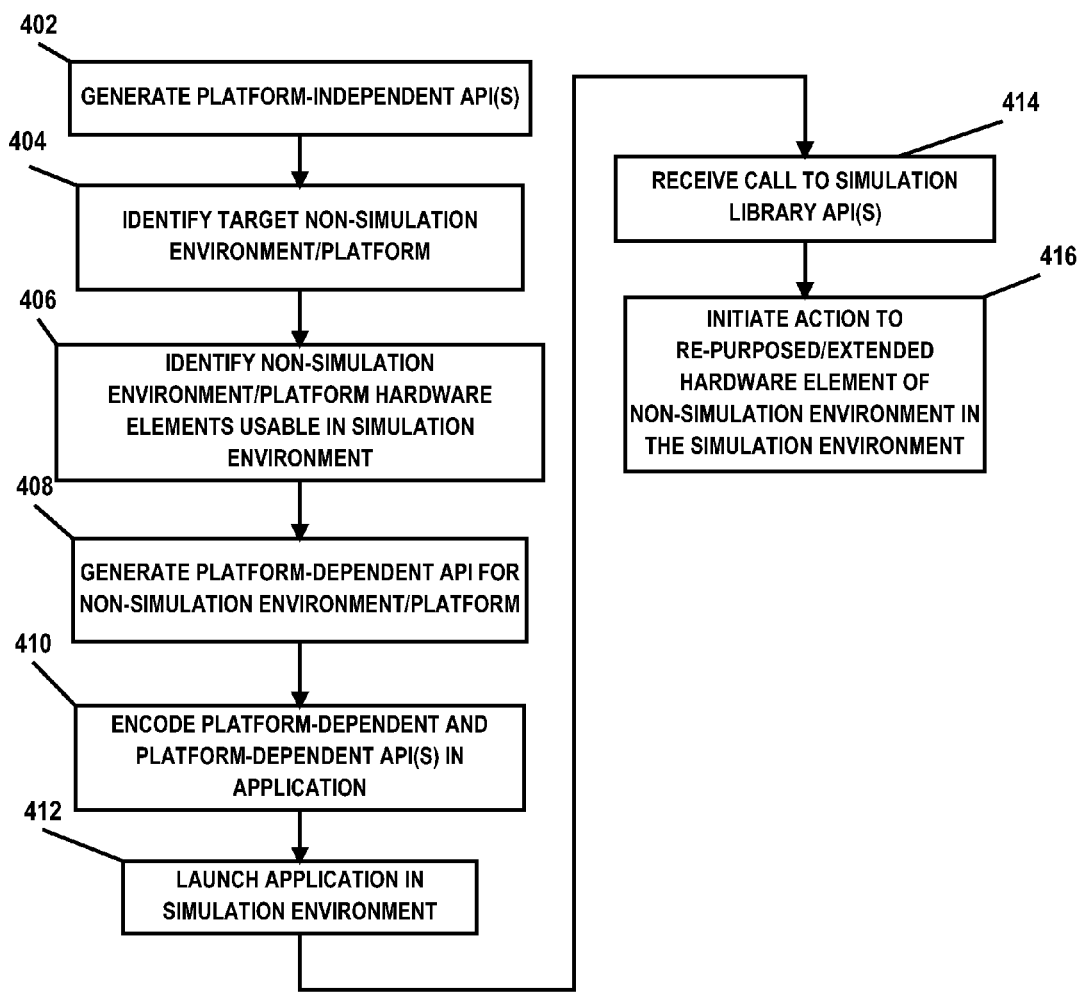
FIG. 4 is a flow diagram illustrating an embodiment of a method for a hybrid platform-dependent simulation interface according to the present disclosure.

FIG. 4 is a flow diagram illustrating an embodiment of a method for a hybrid platform-dependent simulation interface. The method begins at block 402, where platform-independent API(s) 370 are created/generated. At block 404, a target non-simulation environment/platform is identified for application 312 (e.g., a particular operating system/hardware environment that will host application 312 in a production or non-simulation environment). At block 406, one or more hardware elements of the target non-simulation environment/platform are identified that may be re-purposed/extended for simulation environment functionality (e.g., grounded and/or unused I/O connections, unused memory registers, bus addresses, etc.). At block 408, platform-dependent API(s) 372 are created/generated based on the hardware elements identified at block 406.

At block 410, platform-independent API(s) 370 and platform-dependent API(s) 372 are encoded into and/or otherwise generated as part of application 312 (e.g., as simulation library 322). At block 412, application 312 may be launched in simulation environment 302. At block 414, library 322 receives a call (e.g., from simulation engine 310). At block 416, library 322 causes a state change or other signal process to a particular hardware element re-purposed/extended from the non-simulation environment for simulation environment functionality.

Thus, embodiments of the present disclosure enable utilization of hardware elements from a target platform/environment for simulation environment functions such that the selected hardware elements, if similarly utilized in the non-simulation environment, would not adversely affect the non-simulation platform or running application. For example, embodiments of the present disclosure re-purpose and/or extend hardware elements that would be present in a non-simulation environment for simulation environment functions. The selected hardware elements may be unused hardware elements or other types of hardware elements that if similarly controlled/used in the non-simulation environment, the application and non-simulation platform would be unaffected by such use. The simulation library enabling the use of such re-purposed/extended hardware elements for simulation functions is coded as part of the application itself, thereby resulting in the application being executable in simulation or non-simulation environments without an indication to the application that it may be running in a simulation environment. Thus, the simulation library that is encoded as part of the application effectively hides from the application that particular environment (simulation or non-simulation) the application is running in.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method, comprising:
   encoding an application with a library having a platform-independent application programming interface (API) for interacting with a simulation engine, the simulation engine providing a simulated environment for hosting the application; and
   encoding the library with a platform-dependent API providing an interface to the simulation engine using a platform-dependent hardware element, the platform-dependent hardware element unaffecting a non-simulation environment when the application is running in the non-simulation environment.

2. The method of claim 1, further comprising encoding the platform-dependent library to utilize an unused input/output (I/O) interface of the non-simulation environment to interface with the simulation engine.

3. The method of claim 1, further comprising encoding the platform-dependent library to utilize an unused memory region of the non-simulation environment to interface with the simulation engine.

4. The method of claim 1, further comprising encoding the platform-dependent library to utilize an unused signal bus of the non-simulation environment to interface with the simulation engine.

5. The method of claim 1, further comprising encoding the platform-dependent library to utilize an address range on a bus that is nonexistent in the non-simulation environment to interface with the simulation engine.

6. The method of claim 1, further comprising encoding the platform-dependent library to communicate over an I/O bus of the non-simulation environment to a peripheral device that is nonexistent in the non-simulation environment.

7. A method, comprising:
   configuring a simulation library having a platform-independent application programming interface (API) for interacting with a simulation engine, the simulation engine providing a simulated environment for hosting an application;
   configuring the simulation library with a platform-dependent API providing an interface to the simulation engine using a platform-dependent hardware element, the platform-dependent hardware element re-purposed from a function in a non-simulation environment to a different function when the application is running in the simulation environment; and
   incorporating the simulation library in the application.

8. The method of claim 7, further comprising configuring the platform-dependent library to utilize an unused input/output (I/O) interface of the non-simulation environment to interface with the simulation engine.

9. The method of claim 7, further comprising configuring the platform-dependent library to utilize an unused memory region of the non-simulation environment to interface with the simulation engine.

10. The method of claim 7, further comprising configuring the platform-dependent library to utilize an unused signal bus of the non-simulation environment to interface with the simulation engine.

11. The method of claim 7, further comprising configuring the platform-dependent library to utilize an address range on a bus that is nonexistent in the non-simulation environment to interface with the simulation engine.

12. The method of claim 7, further comprising configuring the platform-dependent library to communicate over an I/O bus of the non-simulation environment to a peripheral device that is nonexistent in the non-simulation environment.

* * * * *